(12) United States Patent
Takeda et al.

(10) Patent No.: US 11,881,418 B2
(45) Date of Patent: Jan. 23, 2024

(54) WAFER CLEANING APPARATUS

(71) Applicant: DISCO CORPORATION, Tokyo (JP)

(72) Inventors: Shohei Takeda, Tokyo (JP); Tomohisa Ishikawa, Tokyo (JP); Tsunaki Sakai, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 148 days.

(21) Appl. No.: 17/339,354

(22) Filed: Jun. 4, 2021

(65) Prior Publication Data

US 2022/0005710 A1 Jan. 6, 2022

(30) Foreign Application Priority Data

Jul. 1, 2020 (JP) .................................. 2020-113983

(51) Int. Cl.
*H01L 21/06* (2006.01)
*H01L 21/687* (2006.01)
*B08B 3/02* (2006.01)
*B08B 13/00* (2006.01)
*H01L 21/67* (2006.01)
*H01L 21/02* (2006.01)

(52) U.S. Cl.
CPC ........ *H01L 21/67051* (2013.01); *B08B 3/022* (2013.01); *B08B 13/00* (2013.01); *H01L 21/68764* (2013.01); *H01L 21/02087* (2013.01)

(58) Field of Classification Search
CPC ......... H01L 21/67051; H01L 21/68764; H01L 21/02087; B08B 13/00; B08B 3/022
See application file for complete search history.

(56) References Cited

U.S. PATENT DOCUMENTS

| | | | | |
|---|---|---|---|---|
| 5,939,139 A | * | 8/1999 | Fujimoto | G03F 7/162 431/231 |
| 10,483,126 B2 | * | 11/2019 | Izumi | H01L 21/67023 |
| 2002/0152958 A1 | * | 10/2002 | Shigemori | H01L 21/67161 118/58 |
| 2003/0098040 A1 | * | 5/2003 | Nam | H01L 21/67051 134/28 |
| 2003/0168089 A1 | * | 9/2003 | Katakabe | H01L 21/67051 134/153 |

(Continued)

FOREIGN PATENT DOCUMENTS

| | | |
|---|---|---|
| JP | 2017168565 A | 9/2017 |
| JP | 2018098241 A | 6/2018 |
| JP | 2019047054 A | 3/2019 |

*Primary Examiner* — Benjamin L Osterhout
(74) *Attorney, Agent, or Firm* — GREER BURNS & CRAIN, LTD.

(57) ABSTRACT

A wafer cleaning apparatus for cleaning a circumferential edge of a wafer includes a cleaning unit that jets water toward the circumferential edge of the wafer from an outer side of the circumferential edge of the wafer held by a holding surface of a holding table, to clean the circumferential edge of the wafer. The cleaning unit includes a first nozzle that jets the water to the circumferential edge of the wafer from an outer side of the circumferential edge of the wafer in a direction parallel to the holding surface, a second nozzle that jets the water to the circumferential edge of the wafer in a direction of 45 degrees downward relative to the holding surface, and a third nozzle that jets the water to the circumferential edge of the wafer in a direction of 45 degrees upward relative to the holding surface.

3 Claims, 3 Drawing Sheets

(56) References Cited

U.S. PATENT DOCUMENTS

| | | | |
|---|---|---|---|
| 2016/0240399 A1* | 8/2016 | Kobayashi | H01L 21/67248 |
| 2018/0133748 A1* | 5/2018 | Fujiwara | B05D 1/002 |
| 2018/0277401 A1* | 9/2018 | Watanabe | H01L 22/20 |
| 2020/0058522 A1* | 2/2020 | Lee | H01L 21/67051 |
| 2021/0066077 A1* | 3/2021 | Bang | H01L 21/67103 |
| 2021/0098249 A1* | 4/2021 | Fujita | B05D 1/02 |

* cited by examiner

WAFER CLEANING APPARATUS

BACKGROUND OF THE INVENTION

Field of the Invention

The present invention relates to a wafer cleaning apparatus.

Description of the Related Art

In the manufacture of a wafer, by slicing a semiconductor ingot, a wafer formed with undulation and/or warpage is obtained. To remove the undulation and/or warpage from this wafer, a protective member including a resin and a sheet is formed on a surface on one side of the wafer, as disclosed in Japanese Patent Laid-open No. 2017-168565.

Then, the surface on one side of the wafer is held by a chuck table through the protective member, and a surface on the other side of the wafer is ground by a grindstone, to thereby remove the undulation and/or warpage.

After grinding the other-side surface of the wafer, the protective member is peeled off, and the one-side surface of the wafer is ground, as disclosed in Japanese Patent Laid-open No. 2018-098241. As a result, a wafer with a predetermined thickness is manufactured.

In peeling off the protective member from the wafer, the resin may be left on the circumferential edge (edge) of the wafer. In view of this, the circumferential edge of the wafer is cleaned by a cleaning tool, whereby the adhering resin is removed, as disclosed in Japanese Patent Laid-open No. 2019-047054.

SUMMARY OF THE INVENTION

However, the conventional cleaning method has a problem in that, due to consumption of a sponge as the cleaning tool, the replacement cost for the cleaning tool is required.

Accordingly, it is an object of the present invention to provide a wafer cleaning apparatus capable of removing a resin adhering to a circumferential edge of a wafer, without using any cleaning tool.

In accordance with an aspect of the present invention, there is provided a wafer cleaning apparatus for cleaning a circumferential edge of a wafer, the wafer cleaning apparatus including a holding table that holds the wafer by a holding surface such that the circumferential edge of the wafer protrudes, a motor that rotates the holding table with the center of the holding surface as an axis; a rotation control section that controls a rotational speed of the motor, and a cleaning unit that jets high-pressure water toward the circumferential edge of the wafer from an outer side than the circumferential edge of the wafer held by the holding surface, to clean the circumferential edge of the wafer, in which the cleaning unit includes a first nozzle that jets the high-pressure water to the circumferential edge of the wafer from an outer side than the circumferential edge of the wafer in a 0-degree direction parallel to the holding surface, a second nozzle that jets the high-pressure water to the circumferential edge of the wafer from an outer upper side than the circumferential edge of the wafer in a direction of 45 degrees downward relative to the holding surface, and a third nozzle that jets the high-pressure water to the circumferential edge of the wafer from an outer lower side than the circumferential edge of the wafer in a direction of 45 degrees upward relative to the holding surface, and the first nozzle, the second nozzle, and the third nozzle are disposed to be spaced from one another in a circumferential direction of the wafer.

Preferably, the cleaning unit is configured to jet the high-pressure water utilizing pressure of air by mixing water and the air.

Preferably, the rotation control section is configured to rotate the holding table at a rotational speed of equal to or less than 10 rpm to clean the circumference of the wafer, and thereafter to rotate the holding table at a rotational speed of equal to or more than 1,000 rpm to dry the wafer.

According to the present wafer cleaning apparatus, high-pressure water is blown to the circumferential edge of the wafer from three different directions, whereby the circumferential edge can be cleaned all over, and the resin or the like adhering to the circumferential edge can be removed. Therefore, in the present wafer cleaning apparatus, a cleaning tool such as sponge as a consumable is not needed for cleaning of the circumferential edge. Consequently, a replacing operation for the cleaning tool is unnecessary, so that the cost for replacement of the cleaning tool can be avoided.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
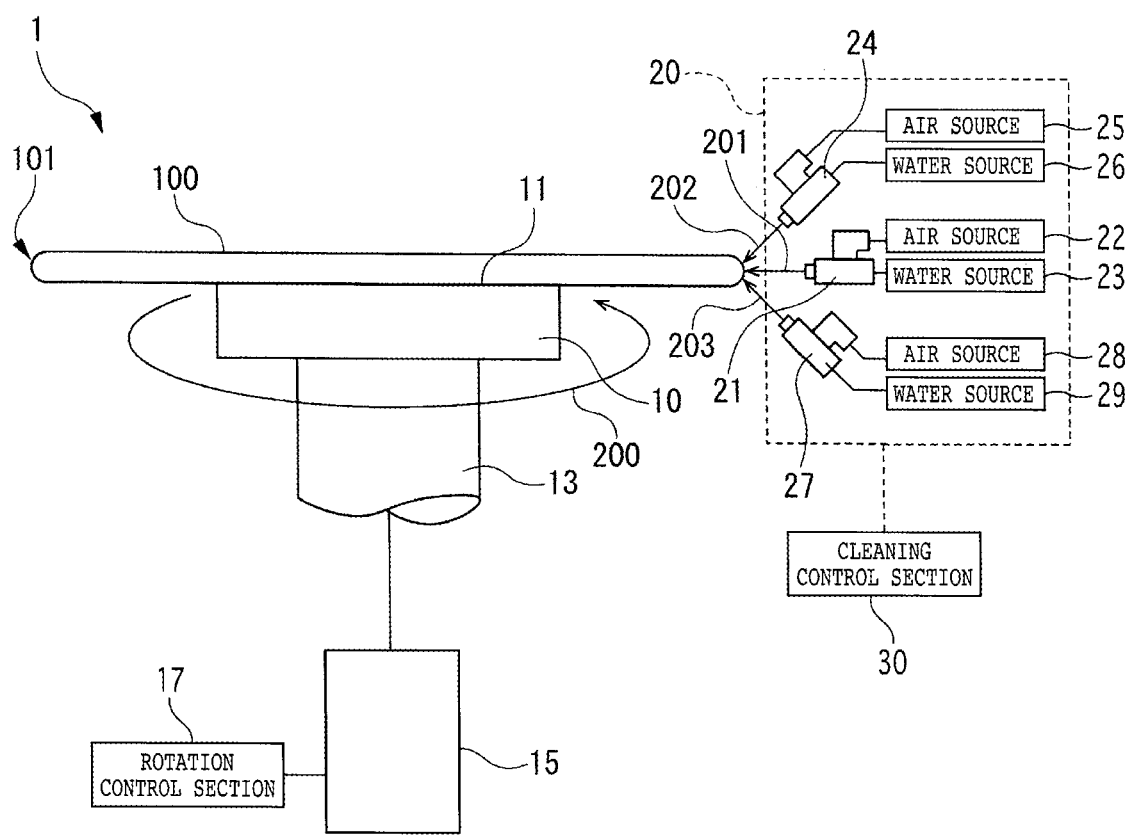
FIG. 1 is a side view depicting the configuration of a wafer cleaning apparatus.

As illustrated in FIG. 1, a wafer cleaning apparatus 1 according to the present embodiment is for cleaning a circumferential edge 101 of a wafer 100. The circumferential edge 101 is chamfered in an arcuate shape from a surface on one side of the wafer 100 to a surface on the other side of the wafer 100, and is rounded.

In addition, the wafer 100 has already been ground, and a protective member formed on one surface thereof has been peeled off. Therefore, a contaminant such as a resin which is the material of the protective member is adhering to the circumferential edge 101 of the wafer 100. The wafer cleaning apparatus 1 cleans the circumferential edge 101 of the wafer 100, to remove the contaminant such as this resin.

The wafer cleaning apparatus 1 includes a holding table 10 for holding the wafer 100. The holding table 10 has a holding surface 11 smaller than the wafer 100. The holding surface 11 includes, for example, a porous material, and by communicating with a suction source (not illustrated), can suction hold the wafer 100. Therefore, the holding table 10 holds the wafer 100 by the holding surface 11 in such a manner that the circumferential edge 101 of the wafer 100 protrudes.

The wafer cleaning apparatus 1 further includes a spindle 13 provided on the lower side of the holding table 10, a motor 15 for rotating the spindle 13, and a rotation control section 17 that controls a rotational speed of the motor 15.

The spindle 13 is configured to be rotatable with the center of the holding surface 11 as an axis. The motor 15, by rotating the spindle 13, can rotate the holding table 10 with the center of the holding surface 11 as an axis, as indicated by an arrow 200.

The wafer cleaning apparatus 1 further has a cleaning unit 20 on the outside of the circumferential edge 101 of the wafer 100 held by the holding surface 11 of the holding table 10. The cleaning unit 20 jets high-pressure water from the outer side than the circumferential edge 101 of the wafer 100 held by the holding surface 11 toward the circumferential edge 101 of the wafer 100, for example, toward the center in the thickness direction of the circumferential edge 101, thereby to clean the circumferential edge 101 of the wafer 100.

As depicted in FIG. 1, the cleaning unit 20 has three nozzles, namely, a first nozzle 21, a second nozzle 24, and a third nozzle 27.

As indicated by an arrow 201 in FIG. 1, the first nozzle 21 jets the high-pressure water to the circumferential edge 101 of the wafer 100 from the outer side than the circumferential edge 101 of the wafer 100, in a 0-degree direction parallel to the holding surface 11 of the holding table 10.

As indicated by an arrow 202 in FIG. 1, the second nozzle 24 jets the high-pressure water to the circumferential edge 101 of the wafer 100 from the outer upper side than the circumferential edge 101 of the wafer 100, in a direction of 45 degrees downward relative to the holding surface 11 of the holding table 10.

As indicated by an arrow 203 in FIG. 1, the third nozzle 27 jets the high-pressure water to the circumferential edge 101 of the wafer 100 from the outer lower side than the circumferential edge 101 of the wafer 100, in a direction of 45 degrees upward relative to the holding surface 11 of the holding table 10.

Figure 2:
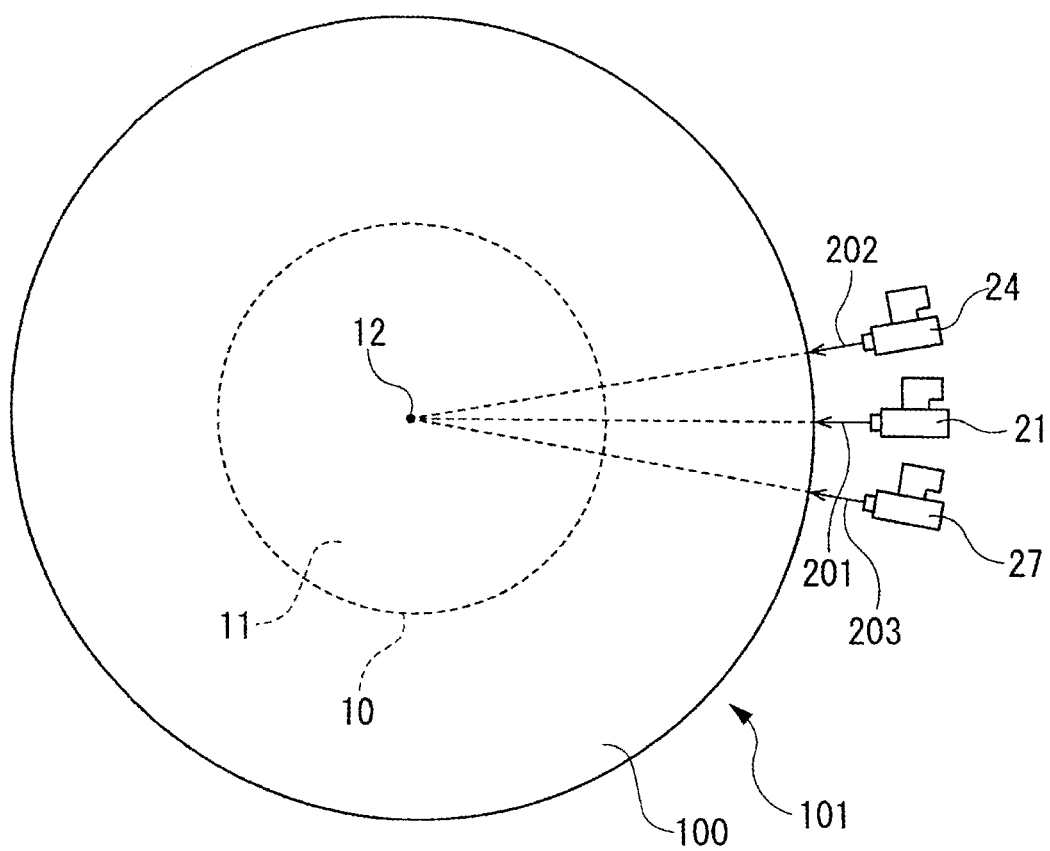
FIG. 2 is a top plan view depicting a wafer, a holding table, and nozzles of a cleaning unit.

In addition, as depicted in FIG. 2, the first nozzle 21, the second nozzle 24, and the third nozzle 27 are spaced at an interval of, for example, 10 degrees from one another in the circumferential direction of the wafer 100. The direction of the high-pressure water jetted from the first nozzle 21, the second nozzle 24, and the third nozzle 27 on a horizontal plane (a plane parallel to the holding surface 11) is toward, for example, a center point 12 which is the center in the radial direction of the holding surface 11 (the center of the wafer 100).

Besides, the cleaning unit 20 is configured to jet the high-pressure water utilizing the pressure of air, by mixing water and the air. In other word, as depicted in FIG. 1, the first nozzle 21, the second nozzle 24, and the third nozzle 27 are connected to an air source 22 and a water source 23, to an air source 25 and a water source 26, and to an air source 28 and a water source 29, respectively.

Then, the first nozzle 21, the second nozzle 24, and the third nozzle 27 are so configured as to mix the water from the respective water sources 23, 26, and 29 and the air from the respective air sources 22, 25, and 28 to produce the high-pressure water utilizing the pressure of the air, in other words, the high-pressure water including a binary fluid cleaning water which is mixed water of the water and the air, and to jet the high-pressure water.

In this way, the first nozzle 21, the second nozzle 24, and the third nozzle 27 function as binary fluid cleaning nozzles. Note that the first nozzle 21, the second nozzle 24, and the third nozzle 27 are configured to be capable of jetting only the air from the respective air sources 22, 25, and 28 and jetting only the water from the respective water sources 23, 26, and 29. The cleaning unit 20 including the first nozzle 21, the second nozzle 24, and the third nozzle 27 is controlled by a cleaning control section 30 depicted in FIG. 1.

Next, an operation of the wafer cleaning apparatus 1 will be described.

[Cleaning Operation]

First, a cleaning operation is carried out. In this operation, first, the wafer 100 is held by the holding surface 11 of the holding table 10.

Thereafter, the cleaning control section 30 supplies the first nozzle 21, the second nozzle 24, and the third nozzle 27 with water at, for example, 40 ml/min from the water sources 23, 26, and 29, and supplies the nozzles 21, 24 and 27 with air at, for example, 70 l/min from the air sources 22, 25, and 28. The first nozzle 21, the second nozzle 24, and the third nozzle 27 mix the water and the air supplied thereto to produce high-pressure water including the binary fluid cleaning water, and starts jetting the high-pressure water to the circumferential edge 101 of the wafer 100 in the respectively set above-described directions.

Next, the rotation control section 17 controls the motor 15 to rotate once the holding table 10 with the wafer 100 held by the holding surface 11 at a rotational speed of equal to or less than 10 rpm (for example, 1 rpm). As a result, cleaning of the wafer 100 is finished, and the rotation control section 17 stops the rotation of the holding table 10 by the motor 15. Simultaneously, the cleaning control section 30 stops the supply of the water and the air to the first nozzle 21, the second nozzle 24, and the third nozzle 27. By this cleaning operation, the contaminant such as resin adhering to the circumferential edge 101 of the wafer 100 is removed.

Note that, in the present embodiment, rotating the wafer 100 once means that the wafer 100 is rotated in such a manner that the three portions of high-pressure water jetted from the first nozzle 21, the second nozzle 24, and the third nozzle 27 are blown to all the part of the circumferential edge 101 of the wafer 100.

Here, as illustrated in FIG. 2, the first nozzle 21, the second nozzle 24, and the third nozzle 27 are disposed to be spaced from one another in the circumferential direction of the wafer 100. Therefore, the rotational angle of one-time rotation is greater than 360 degrees by the amount corresponding to the angular range of layout of the nozzles.

For example, in a case where the first nozzle 21, the second nozzle 24, and the third nozzle 27 are disposed at intervals of 10 degrees in the circumferential direction of the wafer 100, rotating the wafer 100 once means rotating the wafer 100 by approximately 380 degrees.

[Drying Operation]

Next, a drying operation is carried out. In the drying operation, first, the rotation control section 17 controls the motor 15 to rotate the holding table 10 with the wafer 100 held by the holding surface 11 at a rotational speed of equal to or more than 1,000 rpm (for example, 2,000 rpm) for, for example, 20 seconds. In this instance, for the first 15 seconds, jetting of air and the like from the cleaning unit 20 is not conducted, and the water adhering to the wafer 100 is spattered by the rotation of the holding table 10 holding the wafer 100. Note that the rotation of the holding table 10 may not be stopped in the cleaning operation, and switching to the rotational speed of the drying operation may be made immediately after the cleaning operation.

Then, when 15 seconds has been passed from the rotation of the holding table 10, the cleaning control section 30 supplies air from the air sources 22, 25, and 28 to the first nozzle 21, the second nozzle 24, and the third nozzle 27, for five seconds, and starts jetting of air from these nozzles to the wafer 100. In the five seconds, the rotating wafer 100 is supplied with air from three directions, whereby drying of the wafer 100 is promoted.

After five seconds from the start of the supply of air, namely, after 20 seconds from the start of the drying operation, the rotation control section 17, by determining that the drying of the wafer 100 is finished, stops the rotation of the holding table 10 by the motor 15. Concurrently, the cleaning control section 30 stops the supply of air to the first nozzle 21, the second nozzle 24, and the third nozzle 27.

As described above, in the present embodiment, the high-pressure water is blown to the circumferential edge 101 of the wafer 100 from the three different directions, whereby the circumferential edge 101 being rounded can be cleaned all over, and the contaminant such as resin adhering to the circumferential edge 101 can be removed. Therefore, in the present embodiment, a cleaning tool such as sponge as a consumable is not needed for cleaning of the circumferential edge 101. Consequently, an operation of replacing the cleaning tool is unnecessary, so that the cost for replacement of the cleaning tool can be avoided.

Figure 3:
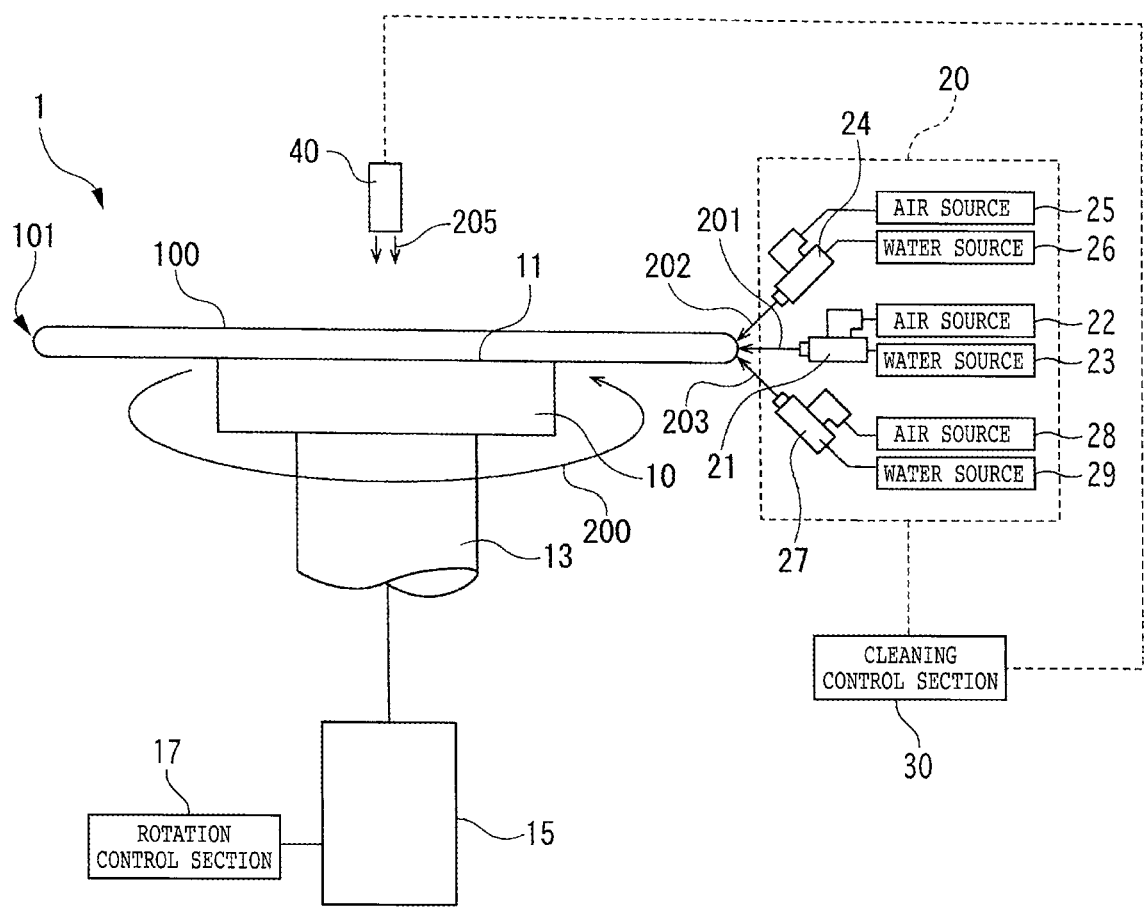
FIG. 3 is a side view depicting another configuration of the wafer cleaning apparatus.

Note that, in the present embodiment, air is jetted to the wafer 100 from the first nozzle 21, the second nozzle 24, and the third nozzle 27 at the time of the drying operation. In relation to this, as depicted in FIG. 3, the wafer cleaning apparatus 1 may further include an air nozzle 40. The air nozzle 40 is disposed on the upper side of the center of the wafer 100 held by the holding surface 11 of the holding table 10 and is configured to jet air as indicated by an arrow 205 to the wafer 100.

In this case, the cleaning control section 30, in the drying operation, jets air toward the wafer 100 from the air nozzle 40, in place of or in addition to the jetting of air to the wafer 100 from the first nozzle 21, the second nozzle 24, and the third nozzle 27. Thus, since the air nozzle 40 is blowing air to the rotational center of the wafer 100, the drying time can be shortened. In addition, air may be jetted to the circumference of the holding table 10 to dry the lower surface of the wafer 100.

In the present embodiment, at the time of the cleaning operation, the rotation control section 17 rotates the holding table 10 holding the wafer 100 once. In relation to this, the rotation control section 17 may rotate the holding table 10 twice or more, and may rotate the holding table 10 by 360 degrees.

In addition, in the present embodiment, the drying by only rotation of the holding table 10 is carried out for 15 seconds, and thereafter the drying with additional jetting of air from the cleaning unit 20 is carried out for five seconds. In relation to this, the time of the drying by only the rotation of the holding table 10 and the time of the drying with the additional jetting of air may be set optionally.

Besides, in the present embodiment, the first nozzle 21, the second nozzle 24, and the third nozzle 27 are provided with the air sources 22, 25, and 28 and the water sources 23, 26, and 29, respectively. In place of this, the first nozzle 21, the second nozzle 24, and the third nozzle 27 may be configured to communicate with a common air source and a common water source.

The present invention is not limited to the details of the above described preferred embodiment. The scope of the invention is defined by the appended claims an all changes and modifications as fall within the equivalence of the scope of the claims are therefore to be embraced by the invention.

What is claimed is:

1. A wafer cleaning apparatus for cleaning a circumferential edge of a wafer, the wafer cleaning apparatus comprising:
    a holding table that holds the wafer by a holding surface such that the circumferential edge of the wafer protrudes;
    a motor that rotates the holding table with a center of the holding surface as an axis,
    a rotation control section that controls a rotational speed of the motor; and
    a cleaning unit that jets water toward the circumferential edge of the wafer from an outer side of the circumferential edge of the wafer held by the holding surface, to clean the circumferential edge of the wafer,
    wherein the cleaning unit includes:
        a first nozzle that jets the water to the circumferential edge of the wafer from the outer side of the circumferential edge of the wafer in a 0-degree direction parallel to the holding surface,
        a second nozzle that jets the water to the circumferential edge of the wafer from an outer upper side of the circumferential edge of the wafer in a direction of 45 degrees downward relative to the holding surface, and
        a third nozzle that jets the water to the circumferential edge of the wafer from an outer lower side of the circumferential edge of the wafer in a direction of 45 degrees upward relative to the holding surface, and
    the first nozzle, the second nozzle, and the third nozzle are disposed to be spaced from one another in a circumferential direction of the wafer.

2. The wafer cleaning apparatus according to claim 1, wherein the cleaning unit is configured to jet the water utilizing pressure of air by mixing water and the air.

3. The wafer cleaning apparatus according to claim 1, wherein the rotation control section is configured to rotate the holding table at a rotational speed of equal to or less than 10 rpm to clean a circumference of the wafer, and thereafter to rotate the holding table at a rotational speed of equal to or more than 1,000 rpm to dry the wafer.

* * * * *